US012707708B2

(12) United States Patent
Jin et al.

(10) Patent No.: US 12,707,708 B2
(45) Date of Patent: Aug. 11, 2026

(54) SEMICONDUCTOR STRUCTURE AND METHOD FOR FORMING SAME

(71) Applicant: Semiconductor Manufacturing International (Shanghai) Corporation, Shanghai (CN)

(72) Inventors: Jisong Jin, Shanghai (CN); Zhankui Zhu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 552 days.

(21) Appl. No.: 18/096,643

(22) Filed: Jan. 13, 2023

(65) Prior Publication Data

US 2023/0299075 A1 Sep. 21, 2023

(30) Foreign Application Priority Data

Mar. 21, 2022 (CN) ......................... 202210278460.5

(51) Int. Cl.

| | |
|---|---|
| ***H10D 84/80*** | (2025.01) |
| ***H10D 1/47*** | (2025.01) |
| ***H10D 30/01*** | (2025.01) |
| ***H10D 30/62*** | (2025.01) |
| ***H10D 64/01*** | (2025.01) |

(52) U.S. Cl.

CPC ............. *H10D 84/811* (2025.01); *H10D 1/47* (2025.01); *H10D 30/024* (2025.01); *H10D 30/6211* (2025.01); *H10D 30/6219* (2025.01); *H10D 64/01* (2025.01); *H10D 64/017* (2025.01)

(58) Field of Classification Search

CPC ...... H10D 84/811; H10D 1/47; H10D 30/024; H10D 30/6211; H10D 30/6219; H10D 64/01; H10D 64/017; H10D 30/014; H10D 30/43; H10D 30/797; H10D 62/121; H10D 62/822; H10D 86/80; H10D 84/834; H10D 84/0149; H10D 84/0186; H10D 84/038; B82Y 10/00

USPC .......................................................... 257/379

See application file for complete search history.

(56) References Cited

U.S. PATENT DOCUMENTS

2009/0090977 A1* 4/2009 Freeman ........... H01L 21/28088 438/383

* cited by examiner

*Primary Examiner* — Theresa T Doan
(74) *Attorney, Agent, or Firm* — Crowell & Moring LLP

(57) ABSTRACT

Semiconductor structures and methods for forming the same are provided. In one form, a semiconductor structure includes: a substrate; a first dielectric layer, located on the substrate; a trench, located in the first dielectric layer; a conductive layer, located on a bottom and a sidewall of the trench and configured as a resistor structure; and a second dielectric layer, configured to be filled in the trench where the conductive layer is formed. By means of embodiments and implementations of the present disclosure, an equivalent conductive sectional area of the resistor structure is increased, and a transverse area occupied by the resistor structure is reduced, thereby miniaturizing the device.

7 Claims, 7 Drawing Sheets

SEMICONDUCTOR STRUCTURE AND METHOD FOR FORMING SAME

RELATED APPLICATION

The present application claims priority to Chinese Patent Appln. No. 202210278460.5, filed Mar. 21, 2022, the entire disclosure of each of which are hereby incorporated by reference.

TECHNICAL FIELD

The present disclosure relates to the field of semiconductor manufacturing, and in particular, to semiconductor structures and methods for forming the same.

BACKGROUND

Generally, an integrated circuit includes an active device and a passive device. The active device includes a MOS transistor, and the passive device includes a resistor structure.

A basic structure of the MOS transistor includes: a channel structure; a gate structure, located on the channel structure; and a source region and a drain region, respectively located on two sides of the gate structure and in contact with end portions of the channel structure along an extending direction.

In order to reduce process costs, the resistor structure is generally formed during formation of the MOS transistor. However, an area currently occupied by the resistor structure is excessively large.

SUMMARY

A technical problem to be addressed by the present disclosure is to provide semiconductor structures and methods for forming the same. In this way, an equivalent conductive sectional area of a resistor structure is increased, and a transverse area occupied by the resistor structure is reduced, thereby miniaturizing a device.

To address the above problem, the present disclosure provides a semiconductor structure. In one form a semiconductor structure includes: a substrate; a first dielectric layer, located on the substrate; a trench, located in the first dielectric layer; a conductive layer, located on a bottom and a sidewall of the trench and configured as a resistor structure; and a second dielectric layer, configured to be filled in the trench where the conductive layer is formed.

The present disclosure further provides a method for forming a semiconductor structure. In one form, a method includes: providing a substrate, where a first dielectric layer is formed on the substrate; forming a trench in the first dielectric layer; forming a conductive layer on a bottom and a sidewall of the trench, where the conductive layer on the bottom and the sidewall of the trench is configured as a resistor structure; and forming, on the conductive layer, a second dielectric layer filled in the trench.

Compared with the prior art, the technical solutions described in the present disclosure have at least the following advantages.

In semiconductor structures provided in the present disclosure, the conductive layer is located on the bottom and the sidewall of the trench and configured as the resistor structure. Compared with the resistor structure being a sheet structure or a rectangular structure, the conductive layer is not only located on the bottom of the trench, but also located on the sidewall of the trench. By using a direction parallel to the substrate as a transverse direction, in a same transverse area, the equivalent conductive sectional area of the resistor structure is larger, thereby reducing the transverse area occupied by the resistor structure, and miniaturizing the device.

In methods for forming a semiconductor structure provided in the present disclosure, the trench is formed in the first dielectric layer, and the conductive layer is formed on the bottom and the sidewall of the trench. The conductive layer is configured as the resistor structure. Compared with the resistor structure being a sheet structure or a rectangular structure, the conductive layer is not only located on the bottom of the trench, but also located on the sidewall of the trench. By using a direction parallel to the substrate as a transverse direction, in a same transverse area, the equivalent conductive sectional area of the resistor structure is larger, thereby reducing the transverse area occupied by the resistor structure, and miniaturizing the device.

DETAILED DESCRIPTION

As discussed in the background, an area occupied in conventional semiconductor structures by a resistor structure is excessively large. Reasons why a performance of these semiconductor structure needs to be improved are analyzed below.

Figure 1:
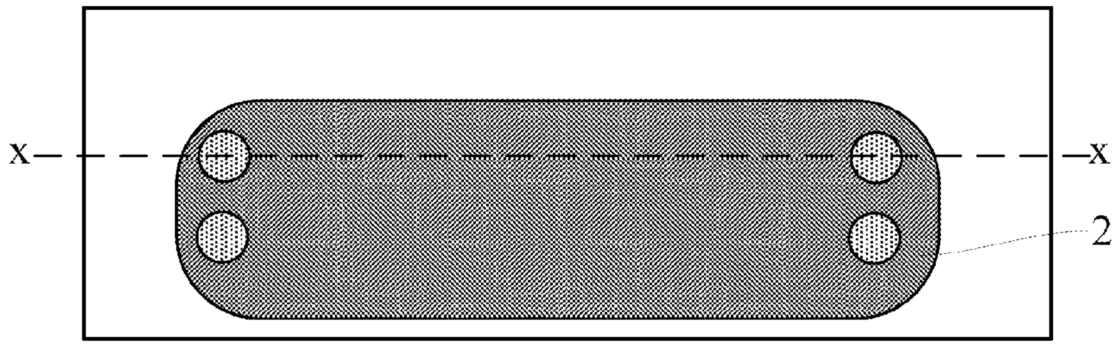
FIG. 1 and FIG. 2 each illustrate a schematic structural diagram of a semiconductor structure.
Figure 2:
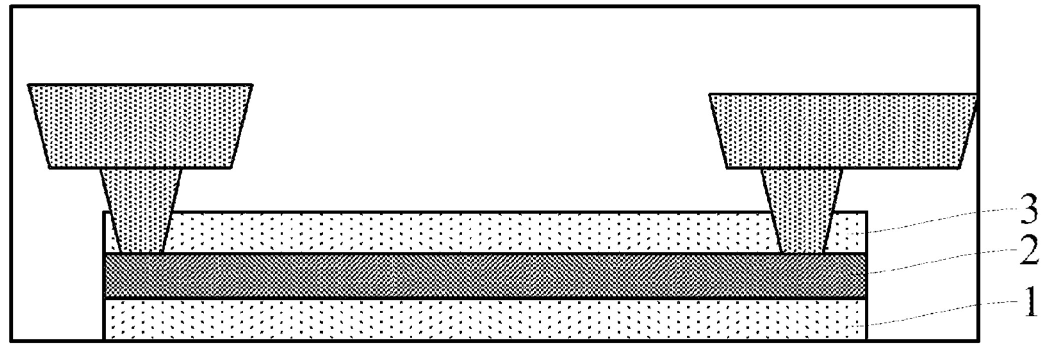

FIG. 1 to FIG. 2 are each a schematic structural diagram of a semiconductor structure. FIG. 1 is a top view, and FIG. 2 is a cross-sectional view of FIG. 1 along a direction xx.

The semiconductor structure includes: a first dielectric layer 1; a conductive layer 2, located on a top of the first dielectric layer 1, where the conductive layer 2 is a sheet structure and is configured as a resistor structure; and a second dielectric layer 3, located on a top of the conductive layer 2.

The conductive layer 2 is located on the top of the first dielectric layer 1, and the conductive layer 2 is the sheet structure.

The conductive layer 2 occupies a relatively large area, which is not conducive to miniaturization of a device.

In order to address the technical problem, the present disclosure provides semiconductor structures. In one form, a semiconductor structure includes: a substrate; a first dielectric layer, located on the substrate; a trench, located in the first dielectric layer; a conductive layer, located on a bottom and a sidewall of the trench and configured as a resistor structure; and a second dielectric layer, configured to be filled in the trench where the conductive layer is formed.

In implementations of the semiconductor structure provided in the present disclosure, the conductive layer is located on the bottom and the sidewall of the trench and configured as the resistor structure. Compared with the resistor structure being a sheet structure or a rectangular structure, the conductive layer is not only located on the bottom of the trench, but also located on the sidewall of the trench. By using a direction parallel to the substrate as a transverse direction, in a same transverse area, the equivalent conductive sectional area of the resistor structure is larger, thereby reducing the transverse area occupied by the resistor structure, and miniaturizing the device.

Figure 3:
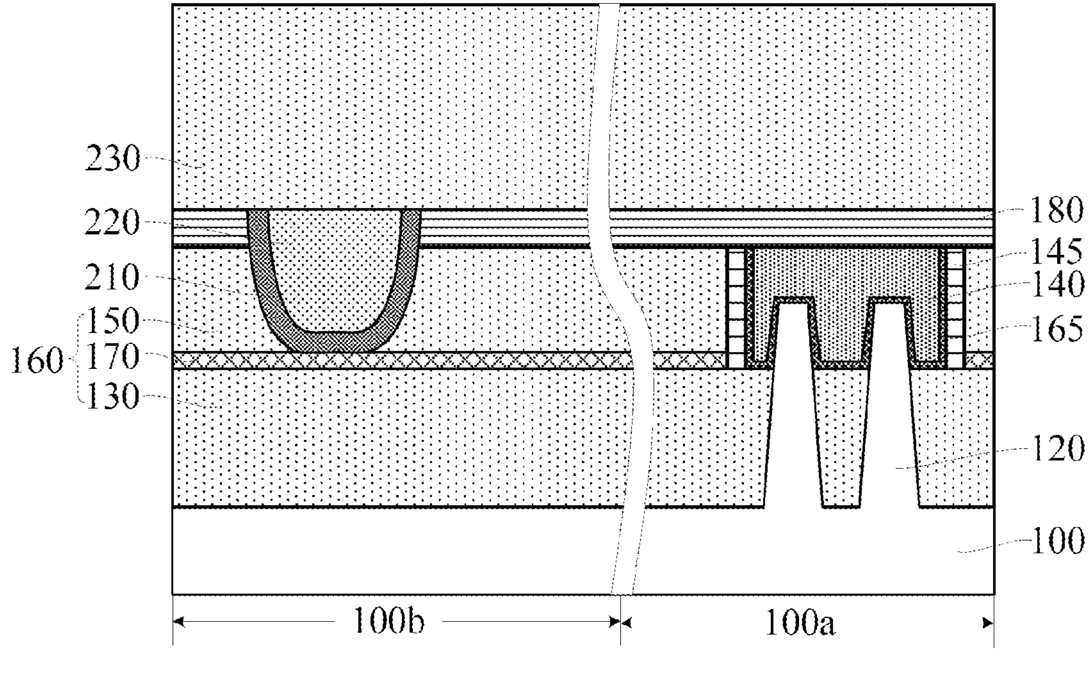
FIG. 3 to FIG. 5 each illustrate a schematic structural diagram of one form of a semiconductor structure according to the present disclosure.
Figure 4:
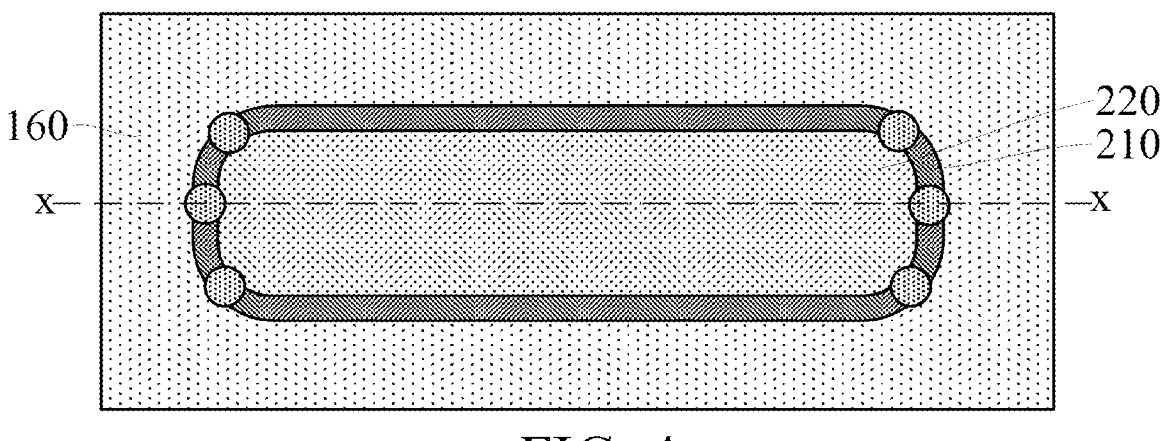
Figure 5:
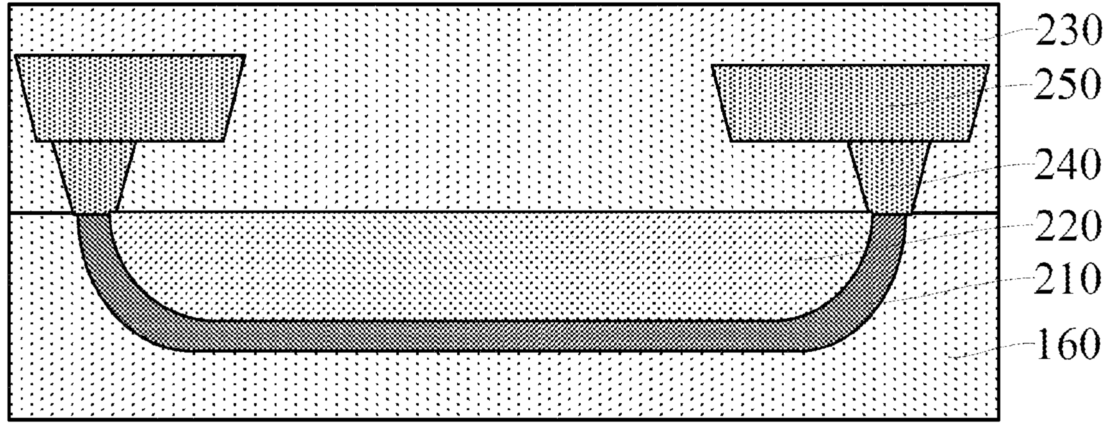

In order to make the foregoing objectives, features, and advantages of embodiments and implementations of the present disclosure more apparent and easier to understand, specific embodiments and implementations of the present disclosure are described in detail below with reference to the accompanying drawings. Referring to FIG. 3 to FIG. 5, FIG. 3 to FIG. 5 are schematic structural diagrams of one form of a semiconductor structure according to the present disclosure. FIG. 3 is a cross-sectional view along an extending direction perpendicular to a channel structure, FIG. 4 is a top view corresponding to a resistor region in FIG. 3, and FIG. 5 is a cross-sectional view of FIG. 4 along a direction xx.

In this form, the semiconductor structure includes: a substrate 100; a first dielectric layer 160, located on the substrate 100; a trench 200 (refer to FIG. 8), located in the first dielectric layer 160; a conductive layer 210, located on a bottom and a sidewall of the trench 200 and configured as a resistor structure; and a second dielectric layer 220, configured to be filled in the trench 200 where the conductive layer 210 is formed.

A material of the substrate 100 includes: one or more of monocrystalline silicon, germanium, silicon germanium, silicon carbide, gallium nitride, gallium arsenide, or indium gallium. In some implementations, the material of the substrate 100 is silicon. Therefore, the substrate 100 is a silicon substrate.

In some implementations, the substrate 100 includes a device region 100*a* configured to form a transistor and a resistor region 100*b* configured to form the resistor structure.

Specifically, the transistor includes one or two of an NMOS transistor or a PMOS transistor.

The first dielectric layer 160 is configured to provide a platform for subsequent formation of the trench, and is further configured to achieve electrical isolation between adjacent conductive layers.

The first dielectric layer 160 is made of a dielectric insulating material. For example, a material of the first dielectric layer 160 includes one or more of silicon oxide, silicon nitride, or silicon oxynitride. The first dielectric layer 160 may be a single-layer structure or a multilayer structure.

In some implementations, the semiconductor structure further includes: a channel structure 120, located on the substrate 100 of the device region 100*a*; an isolation layer 130, located on the substrate 100 and surrounding the isolation layer 130 of the channel structure 120; and an interlayer dielectric layer 150, located on the isolation layer 130, where the interlayer dielectric layer 150 and the isolation layer 130 are configured as the first dielectric layer 160. The channel structure 120 is configured to provide a conductive channel for the transistor.

In some implementations, the transistor is a fin field effect transistor by way of example for description. The channel structure 120 protrudes from the substrate 100, and the channel structure 120 is a fin.

In some implementations, the fin and the substrate 100 are integrally formed. A material of the fin is the same as the material of the substrate 100, which is silicon. In other implementations, the material of the fin may be different from the material of the substrate, and the material of the fin may be other suitable materials, for example, one or more of germanium, silicon germanium, silicon carbide, gallium nitride, gallium arsenide, or indium gallium.

In some implementations, a plurality of fins are arranged, and the plurality of fins are separately arranged on the substrate 100 of the device region 100*a*.

In some other implementations, during formation of other types of transistors, the channel structure may further be other types of structures. For example, during formation of a gate-all-around transistor, the channel structure includes one or more channel layers suspended and spaced apart from the substrate. The channel layer is configured to provide a conductive channel of the gate-all-around transistor.

The isolation layer 130 is configured to isolate adjacent channel structures from each other, and is further configured to isolate a gate structure 140 from the substrate 100. Specifically, in some implementations, the isolation layer 130 is configured to isolate adjacent fins from each other.

Therefore, a material of the isolation layer 130 is an insulating dielectric material. For example, the material of the isolation layer 130 includes one or more of silicon oxide, silicon nitride, or silicon oxynitride.

In some implementations, the semiconductor structure further includes: a gate structure 140, located on the isolation layer 130 of the device region 100*a* and spanning the channel structure 120; a source/drain doped region (not shown in the figure), located on two sides of the gate structure 140 and in contact with end portions of the channel structure 120 along an extending direction.

Correspondingly, the interlayer dielectric layer 150 is located on the isolation layer 130 on a side of the gate structure 140.

In some implementations, the gate structure 140 is a device gate structure. During operation of the device, the gate structure 140 is configured to control opening and closing of the conductive channel of the transistor.

In some implementations, the gate structure 140 spans the fin and covers a part of a top and a part of a sidewall of the fin. In other implementations, when the transistor is a gate-all-around transistor, the gate structure correspondingly surrounds the channel layer.

In some implementations, the gate structure 140 is a metal gate structure. In other implementations, the gate structure may further be other types of gate structures, for example, a polysilicon gate structure, an amorphous silicon gate structure, or the like.

In some implementations, the gate structure 140 may include a work function layer and a gate electrode layer on the work function layer. In some implementations, a material of the gate structure 140 includes any one or more of TiAl, TiALC, TaAlN, TiAlN, MoN, TaCN, AlN, Ta, TiN, TaN, TaSiN, TiSiN, W, Co, Al, Cu, Ag, Au, Pt, or Ni.

It should be noted that, in some implementations, a gate dielectric layer 165 is further formed between the gate structure 140 and the channel structure 120. The gate dielectric layer 165 is configured to achieve insulation between the gate structure 140 and a conductive channel. In some implementations, the gate dielectric layer 165 is further located between the gate structure 140 and the isolation layer 130 and on a sidewall of the gate structure 140.

In some implementations, the gate dielectric layer 165 may include a gate oxide layer and a high-k gate dielectric layer on the gate oxide layer. A material of the gate oxide layer includes one or more of silicon oxide, silicon nitride, or silicon oxynitride, and a material of the high-k gate dielectric layer includes one or more of $HfO_2$, $ZrO_2$, HfSiO, HfSiON, HfTaO, HfTiO, HfZrO, $La_2O_3$, or $Al_2O_3$.

In other implementations, the gate dielectric layer may further include only the gate oxide layer or only the high-k gate dielectric layer.

In some implementations, a spacer 145 is further formed on the sidewall of the gate structure 140. The spacer 145 is configured to protect the sidewall of the gate structure 140 and further configured to define a formation position of the source/drain doped region.

A material of the spacer 145 includes one or more of silicon oxide, silicon nitride, a low-k material, or an ultra low-k material.

The source/drain doped region is used as a source or a drain of a field effect transistor. During operation of the field effect transistor, the source/drain doped region is configured to provide a carrier source. In some implementations, the source/drain doped region is located in the fins on two sides of the gate structure 140 and the spacer 145.

In some implementations, the source/drain doped region include a stress layer doped with ions. The stress layer is configured to provide a stress for a channel region, thereby improving mobility of a carrier. During formation of the PMOS transistor, the source/drain doped region includes a stress layer doped with P-type ions, and a material of the stress layer is Si or SiGe. During formation of the NMOS transistor, the source/drain doped region includes a stress layer doped with N-type ions, and a material of the stress layer is Si or SiC.

The interlayer dielectric layer 150 is configured to isolate adjacent devices from each other. Specifically, the interlayer dielectric layer 150 covers a sidewall of the spacer 145.

A material of the interlayer dielectric layer 150 is an insulating material. A material of the interlayer dielectric layer 150 includes one or more of silicon oxide, silicon oxynitride, silicon nitride, silicon carbide, silicon carbonitride, silicon oxycarbonitride, silicon germanium oxide, boron nitride, or boron carbonitride. In some implementations, the material of the interlayer dielectric layer 150 is silicon oxide.

In some implementations, the semiconductor structure further includes: a contact etch stop layer 170, located between the isolation layer 130 and the interlayer dielectric layer 150.

In the field of semiconductors, the semiconductor structure generally further includes a source/drain interconnect layer (not shown in the figure) extending through the interlayer dielectric layer 150 and in contact with the source/drain doped region. The step of forming the source/drain interconnect layer generally includes: forming an interconnect trench extending through the interlayer dielectric layer 150 on a top of the source/drain doped region, and forming the source/drain interconnect layer in the interconnect trench. In some implementations, the contact etch stop layer 170 is configured to temporarily define a position where etching stops during the formation of the interconnect trench, so as to improve etching consistency of the interconnect trench and reduce damage to the source/drain doped region caused by the process for forming the interconnect trench. In addition, the contact etch stop layer 170 is further configured to define a position where the etching stops during the formation of the trench, so as to improve height uniformity of the bottom of the trench.

The contact etch stop layer 170 is made of a material having etch selectivity to the materials of the interlayer dielectric layer 150 and the isolation layer 130. As an example, the materials of the interlayer dielectric layer 150 and the isolation layer 130 are both silicon oxide, and a material of the contact etch stop layer 170 is silicon nitride.

The trench 200 is configured to provide a space for forming the conductive layer 210.

In some implementations, the trench 200 extends through the interlayer dielectric layer 150 of the resistor region **100*b***. In the field of semiconductors, the semiconductor structure generally further includes: a source/drain interconnect layer, located in the interlayer dielectric layer and in contact with the source/drain doped region; a source/drain plug, in contact with the source/drain interconnect layer; and a gate plug, in contact with a gate structure.

In some implementations, the resistor structure is located in the interlayer dielectric layer 150. Accordingly, the connection structure in contact with the resistor structure can be formed by using the process for forming the source/drain plug or forming the gate plug. In this way, the electrical connection between the resistor structure and an external circuit is realized, thereby reducing the difficulty of realizing the electrical connection between the resistor structure and the external circuit.

As an example, the contact etch stop layer 170 is exposed from the bottom of the trench 200. That is to say, during the formation of the semiconductor structure, the trench 200 can be formed in the interlayer dielectric layer 150 of the resistor region **100*b* by using the top surface of the contact etch stop layer 170 as the stop position. In this way, a height of the bottom of the trench 200 can be accurately controlled, thereby improving height consistency of the bottom of the trench 200 in the resistor region 100*b***.

It should be noted that, in some implementations, the trench 200 extends through the interlayer dielectric layer 150 of the resistor region **100*b*** by way of example for description. In other implementations, the trench may further extend through the interlayer dielectric layer and the contact etch stop layer of the resistor region. Alternatively, the trench may extend through the interlayer dielectric layer and the contact etch stop layer of the resistor region and a certain thickness of the isolation layer.

In some implementations, the semiconductor structure further includes: a source/drain interconnect layer (not shown in the figure), extending through the interlayer dielectric layer 150 on the top of the source/drain doped region and in contact with the source/drain doped region.

The source/drain interconnect layer is configured to realize the electrical connection between the source/drain doped region and the external circuit.

A material of the source/drain interconnect layer is a conductive material. In some implementations, the material of the source/drain interconnect layer includes one or more of W, Co, Cu, Ru, or Ni.

During the formation of the semiconductor structure, the step of forming the source/drain interconnect layer includes: forming an interconnect trench extending through the interlayer dielectric layer 150 on the top of the source/drain doped region; and forming the source/drain interconnect layer in the interconnect trench.

In some implementations, the semiconductor structure further includes: a hard mask layer 180, located on the first dielectric layer 160 and the gate structure 140. The hard mask layer 180 is configured as a mask for forming the trench 200 and the interconnect trench.

In some implementations, the hard mask layer 180 is made of an insulating dielectric material. Therefore, the hard mask layer 180 can be retained in the semiconductor structure after the resistor structure is formed, so that the step of removing the hard mask layer 180 can be omitted. Etch selectivity exists between the material of the hard mask layer 180 and the material of the first dielectric layer 160. As an example, the material of the hard mask layer 180 includes silicon nitride.

In other implementations, the hard mask layer may be omitted from the semiconductor structure.

Compared with the resistor structure being a sheet structure or a rectangular structure, the conductive layer 210 is not only located on the bottom of the trench 200, but also located on the sidewall of the trench 200. By using a direction parallel to the substrate 100 as a transverse direction, in a same transverse area, the equivalent conductive sectional area of the resistor structure is larger, thereby reducing the transverse area occupied by the resistor structure, and miniaturizing the device.

In some implementations, a material of the conductive layer 210 includes one or more of TiAl, TiALC, TaAlN, TiAlN, MoN, TaCN, AlN, Ta, TiN, TaN, TaSiN, TiSiN, W, Co, Al, Cu, Ag, Au, Pt, or Ni. As an example, the material of the conductive layer 210 is TiN.

The second dielectric layer 220 is configured to fill the trench 200 to provide a flat surface for the process. A material of the second dielectric layer 220 is an insulating dielectric material, for example, one or more of silicon oxide, silicon nitride, or silicon oxynitride.

In some implementations, the semiconductor structure further includes: a third dielectric layer 230, covering the first dielectric layer 160, the second dielectric layer 220, and the conductive layer 210; and a connection structure, located in the third dielectric layer 230 and in contact with the conductive layer 210.

The third dielectric layer 230 is configured to achieve electrical isolation between the connection structures. A material of the third dielectric layer 230 is an insulating dielectric material, and includes one or more of silicon oxide, silicon oxynitride, silicon nitride, silicon carbide, silicon carbonitride, silicon oxycarbonitride, silicon germanium oxide, boron nitride, or boron carbonitride.

It should be noted that, for convenience of illustration and description, the third dielectric layer 230 is omitted in FIG. 4. The connection structure is configured to realize the electrical connection between the resistor structure and the external circuit.

In some implementations, the resistor structure is located in the interlayer dielectric layer 150. Accordingly, the connection structure in contact with the resistor structure can be formed by using the process for forming the source/drain plug or forming the gate plug. In this way, the electrical connection between the resistor structure and an external circuit is realized, thereby reducing the difficulty of realizing the electrical connection between the resistor structure and the external circuit.

In some implementations, a top surface of the conductive layer 210 is flush with a top surface of the source/drain interconnect layer. In this way, the electrical connection between the conductive layer 210 and the external circuit or other interconnect structures is realized by using the process for forming the source/drain plug. In other implementations, the top surface of the conductive layer may further be flush with a top surface of the gate structure. In this way, the electrical connection between the conductive layer and the external circuit or other interconnect structures is realized by using the process for forming the gate plug.

As an example, the connection structure includes a contact plug 240 in contact with the conductive layer 210 and an interconnect layer 250 on the contact plug 240.

A material of the connection structure includes one or more of Co, W, Ru, Al, Ir, Rh, Os, Pd, Cu, Pt, Ni, Ta, TaN, Ti, or TiN.

Figure 6:
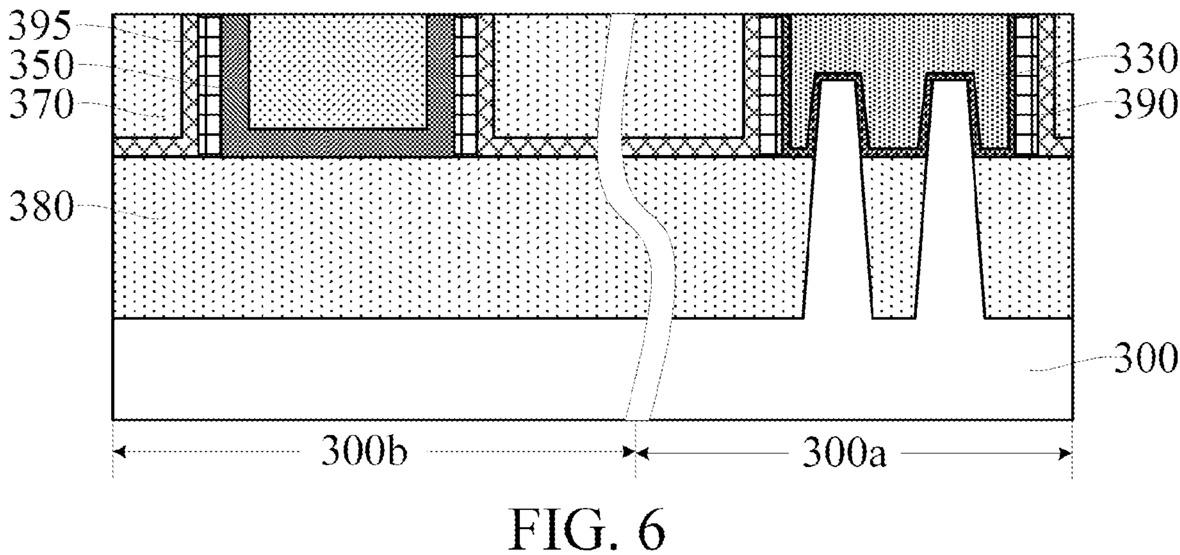
FIG. 6 is a schematic structural diagram of another form of a semiconductor structure according to the present disclosure.

FIG. 6 is a schematic structural diagram of another form of a semiconductor structure according to the present disclosure. For the similarity between this form and the form described above, details are not described herein again. A difference between this form and the form described above include:

In some implementations, the trench is located in the interlayer dielectric layer 370 of the resistor region **300*b*, and an isolation layer 380** is exposed from the trench.

In some implementations, the semiconductor structure further includes a spacer 390, located on a sidewall of a gate structure 330 and between a sidewall of the conductive layer 350 and the interlayer dielectric layer 370.

The spacer 390 is located on the sidewall of the gate structure 330 and between the sidewall of the conductive layer 350 and the interlayer dielectric layer 370. During the formation of the semiconductor structure, a first dummy gate structure is formed on the isolation layer 380 of the resistor region **300*b***. The first dummy gate structure is configured to occupy a space for forming a trench. That is to say, the trench is formed by removing the first dummy gate structure.

Figures 15, 16, 17:
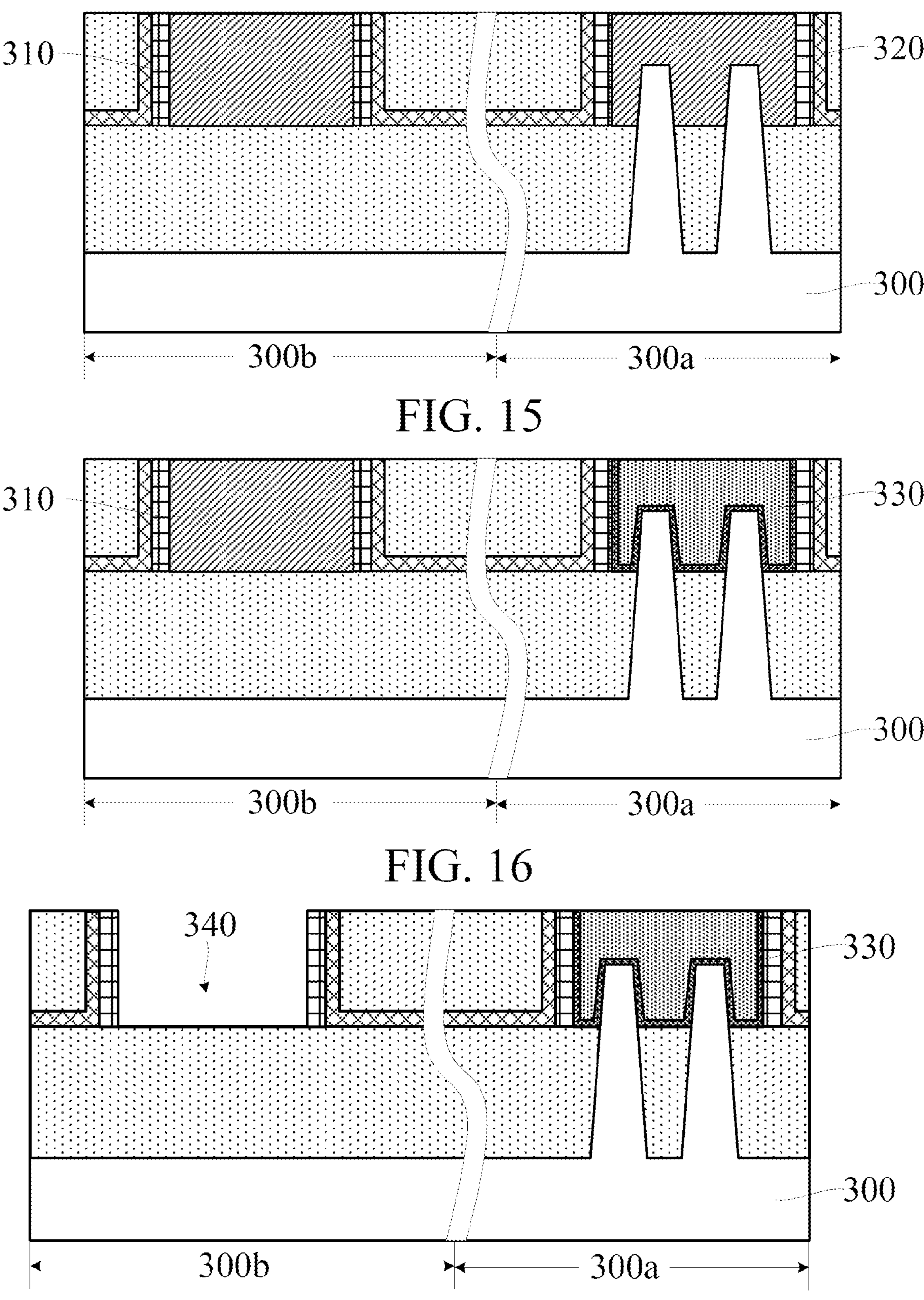
FIG. 15 to FIG. 20 are schematic structural diagrams of steps in another form of a method for forming a semiconductor structure according to the present disclosure.

In addition, referring to FIG. 15, during the formation of the semiconductor structure, before the gate structure is formed, a second dummy gate structure is formed on the device region. The second dummy gate structure and the first dummy gate structure are formed in a same step. In this way, the first dummy gate structure 310 is formed using the process step of forming the second dummy gate structure 320, thereby improving process compatibility.

In some implementations, the semiconductor structure further includes a contact etch stop layer 395, located between the isolation layer 380 and the interlayer dielectric layer 370 and between the spacer 390 and the interlayer dielectric layer 370.

For the related description of the contact etch stop layer 395, refer to a corresponding description of the contact etch stop layer 170 in the foregoing embodiment, and details will not be described herein again.

Accordingly, the present disclosure further provides methods for forming a semiconductor structure. FIG. 7 to FIG. 14 are schematic structural diagrams corresponding to steps in one form of a method for forming a semiconductor structure according to the present disclosure.

A method for forming a semiconductor structure in this form is described in detail below with reference to the accompanying drawings.

Figure 7:
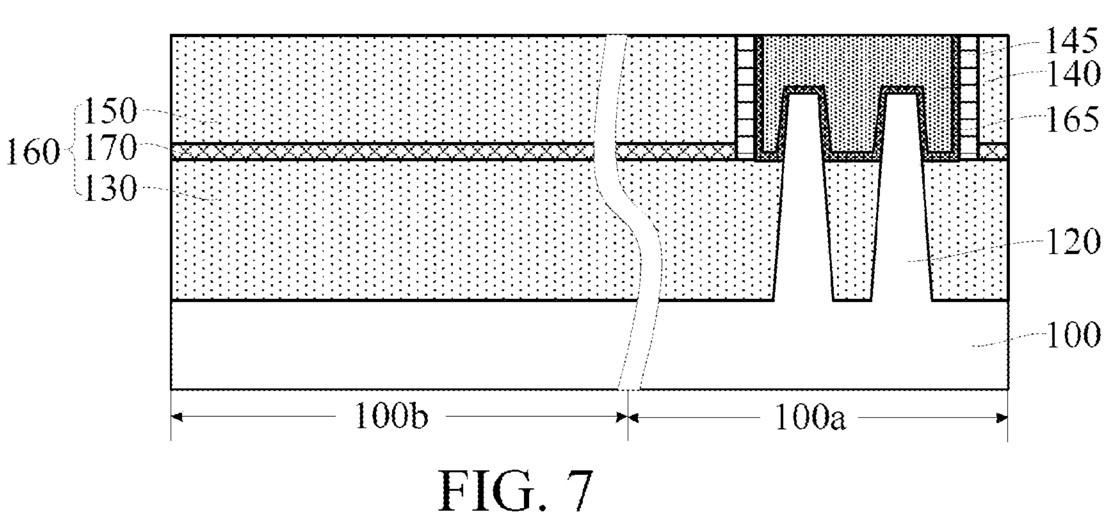
FIG. 7 to FIG. 14 are schematic structural diagrams corresponding to steps in one form of a method for forming a semiconductor structure according to the present disclosure.

Referring to FIG. 7, a substrate 100 is provided, and a first dielectric layer 160 is formed on the substrate 100.

The substrate 100 is configured to provide an operating platform for the subsequent process.

The material of the substrate 100 includes: one or more of monocrystalline silicon, germanium, silicon germanium, silicon carbide, gallium nitride, gallium arsenide, or indium gallium. In some implementations, the material of the substrate 100 is silicon. Therefore, the substrate 100 is a silicon substrate.

In some implementations, the substrate 100 includes a device region **100*a* configured to form a transistor and a resistor region 100*b*** configured to form a resistor structure.

Specifically, the transistor includes one or two of an NMOS transistor or a PMOS transistor.

The first dielectric layer 160 is configured to provide a platform for subsequent formation of the trench, and is further configured to achieve electrical isolation between adjacent conductive layers.

The first dielectric layer 160 is made of a dielectric insulating material. For example, the material of the first dielectric layer 160 includes one or more of silicon oxide, silicon nitride, or silicon oxynitride. The first dielectric layer 160 may be a single-layer structure or a multilayer structure.

In some implementations, in the step of providing the substrate 100, the channel structure 120 is formed on the substrate 100 of the device region 100*a*, and an isolation layer 130 surrounding the channel structure 120 is further formed on the substrate 100. The gate structure 140 on the isolation layer 130 of the device region 100*a* and spanning the channel structure 120 is formed. The source/drain doped region (not shown in the figure) is further formed on two sides of the gate structure 140. The source/drain doped region is in contact with the end portions of the channel structure 120 along the extending direction. An interlayer dielectric layer 150 is formed on the isolation layer 130 on a side of the gate structure 140. The interlayer dielectric layer 150 and the isolation layer 130 are configured as the first dielectric layer 160.

The channel structure 120 is configured to provide a conductive channel for the transistor.

In some implementations, the transistor is a fin field effect transistor by way of example for description. The channel structure 120 protrudes from the substrate 100, and the channel structure 120 is a fin.

In some implementations, the fin and the substrate 100 are integrally formed. A material of the fin is the same as the material of the substrate 100, which is silicon. In other implementations, the material of the fin may be different from the material of the substrate, and the material of the fin may be other suitable materials, for example, one or more of germanium, silicon germanium, silicon carbide, gallium nitride, gallium arsenide, or indium gallium.

In some implementations, a plurality of fins is arranged, and the fins of the plurality of fins are separately arranged on the substrate 100 of the device region 100*a*.

In some other implementations, during formation of other types of transistors, the channel structure may further be other types of structures. For example, during formation of a gate-all-around transistor, the channel structure includes one or more channel layers suspended and spaced apart from the substrate. The channel layer is configured to provide a conductive channel of the gate-all-around transistor.

The isolation layer 130 is configured to isolate adjacent channel structures from each other, and is further configured to isolate a gate structure 140 from the substrate 100. Specifically, in some implementations, the isolation layer 130 is configured to isolate adjacent fins from each other.

Therefore, a material of the isolation layer 130 is an insulating dielectric material. For example, the material of the isolation layer 130 includes one or more of silicon oxide, silicon nitride, or silicon oxynitride.

In some implementations, a gate structure 140 spanning the channel structure 120 is further formed on the isolation layer 130 of the device region 100*a*, and a source/drain doped region (not shown in the figure) is further formed on two sides of the gate structure 140. The source/drain doped region is in contact with end portions of the channel structure 120 along an extending direction.

Correspondingly, the interlayer dielectric layer 150 is located on the isolation layer 130 on a side of the gate structure 140.

In some implementations, the gate structure 140 is a device gate structure. During operation of the device, the gate structure 140 is configured to control opening and closing of the conductive channel of the transistor.

In some implementations, the gate structure 140 spans the fin and covers a part of a top and a part of a sidewall of the fin. In other implementations, when the transistor is a gate-all-around transistor, the gate structure correspondingly surrounds the channel layer.

In some implementations, the gate structure 140 is a metal gate structure. In other implementations, the gate structure may further be other types of gate structures, for example, a polysilicon gate structure, an amorphous silicon gate structure, or the like.

In some implementations, the gate structure 140 may include a work function layer and a gate electrode layer on the work function layer. In some implementations, a material of the gate structure 140 includes any one or more of TiAl, TiALC, TaAlN, TiAlN, MoN, TaCN, AlN, Ta, TiN, TaN, TaSiN, TiSiN, W, Co, Al, Cu, Ag, Au, Pt, or Ni.

It should be noted that, in some implementations, a gate dielectric layer 165 is further formed between the gate structure 140 and the channel structure 120. The gate dielectric layer 165 is configured to achieve insulation between the gate structure 140 and the conductive channel. In some implementations, the gate dielectric layer 165 is further located between the gate structure 140 and the isolation layer 130 and on a sidewall of the gate structure 140.

In some implementations, the gate dielectric layer 165 may include a gate oxide layer and a high-k gate dielectric layer on the gate oxide layer. A material of the gate oxide layer includes one or more of silicon oxide, silicon nitride, or silicon oxynitride, and a material of the high-k gate dielectric layer includes one or more of $HfO_2$, $ZrO_2$, HfSiO, HfSiON, HfTaO, HfTiO, HfZrO, $La_2O_3$, or $Al_2O_3$.

In other implementations, the gate dielectric layer may further include only the gate oxide layer or only the high-k gate dielectric layer.

In some implementations, a spacer 145 is further formed on the sidewall of the gate structure 140. The spacer 145 is configured to protect the sidewall of the gate structure 140 and further configured to define a formation position of the source/drain doped region.

A material of the spacer 145 includes one or more of silicon oxide, silicon nitride, a low-k material, or an ultra low-k material.

The source/drain doped region is used as a source or a drain of a field effect transistor. During operation of the field effect transistor, the source/drain doped region is configured to provide a carrier source. In some implementations, the source/drain doped region is located in the fins on two sides of the gate structure 140 and the spacer 145.

In some implementations, the source/drain doped region include a stress layer doped with ions. The stress layer is configured to provide a stress for a channel region, thereby improving mobility of a carrier. During formation of the PMOS transistor, the source/drain doped region includes a stress layer doped with P-type ions, and a material of the stress layer is Si or SiGe. During formation of an NMOS transistor, the source/drain doped region includes a stress layer doped with N-type ions, and a material of the stress layer is Si or SiC.

The interlayer dielectric layer 150 is configured to isolate adjacent devices from each other. Specifically, the interlayer dielectric layer 150 covers a sidewall of the spacer 145.

A material of the interlayer dielectric layer 150 is an insulating material. A material of the interlayer dielectric layer 150 includes one or more of silicon oxide, silicon oxynitride, silicon nitride, silicon carbide, silicon carbonitride, silicon oxycarbonitride, silicon germanium oxide, boron nitride, or boron carbonitride. In some implementations, the material of the interlayer dielectric layer 150 is silicon oxide.

It should further be noted that, in some implementations, a contact etch stop layer 170 is further formed between the isolation layer 130 and the interlayer dielectric layer 150.

In some implementations, the contact etch stop layer 170 is configured to temporarily define a position where etching stops during the subsequent formation of the interconnect trench, so as to improve etching consistency of the interconnect trench and reduce damage to the source/drain doped region caused by the process for forming the interconnect trench. In addition, the contact etch stop layer 170 is further configured to define a position where the etching stops during the subsequent formation of the trench, so as to improve height uniformity of the bottom of the trench.

The contact etch stop layer 170 is made of a material having etch selectivity to the materials of the interlayer dielectric layer 150 and the isolation layer 130. As an example, the materials of the interlayer dielectric layer 150 and the isolation layer 130 are both silicon oxide, and a material of the contact etch stop layer 170 is silicon nitride.

Figure 8:
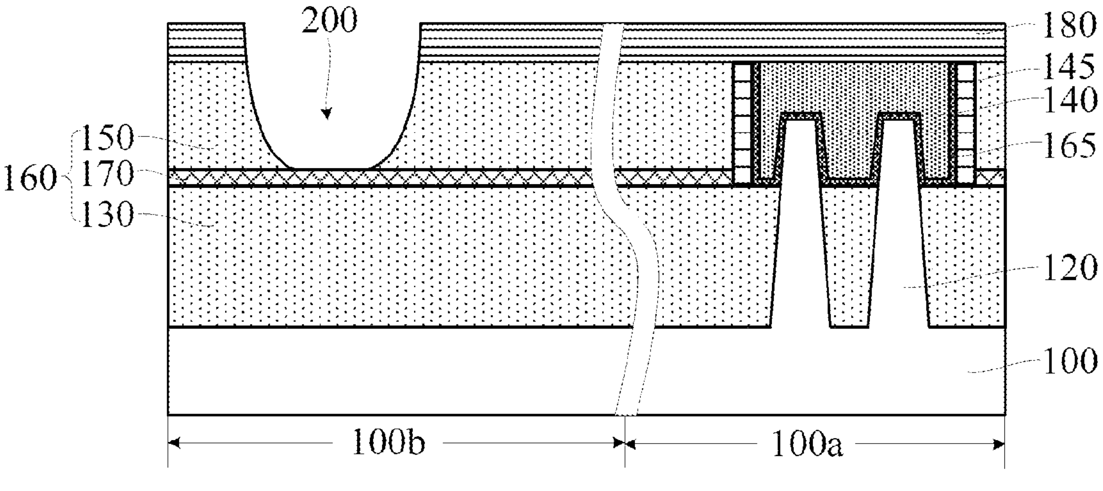

Referring to FIG. 8, a trench 200 is formed in the first dielectric layer 160.

The trench 200 is configured to provide a space for forming the conductive layer.

In some implementations, the step of forming the trench 200 in the first dielectric layer 160 includes: forming the trench 200 in the interlayer dielectric layer 150 of the resistor region **100*b***.

Correspondingly, a conductive layer is subsequently formed on a bottom and a sidewall of the trench 200. The conductive layer on the bottom and the sidewall of the trench 200 is configured as a resistor structure, and the resistor structure is located in the interlayer dielectric layer 150.

In the field of semiconductors, the subsequent step generally further includes: forming a source/drain interconnect layer in the interlayer dielectric layer and in contact with the source/drain doped region; forming a source/drain plug in contact with the source/drain interconnect layer; and forming a gate plug in contact with the gate structure. In some implementations, the resistor structure is located in the interlayer dielectric layer 150. Accordingly, the connection structure in contact with the resistor structure can be formed by using the subsequent process for forming the source/drain plug or forming the gate plug. In this way, the electrical connection between the resistor structure and an external circuit is realized, thereby reducing the difficulty of realizing the electrical connection between the resistor structure and the external circuit.

More specifically, in some implementations, the step of forming the trench 200 includes: forming the trench 200 in the interlayer dielectric layer 150 of the resistor region **100*b* by using a top surface of the contact etch stop layer 170 as a stop position. In this way, a height of the bottom of the trench 200 can be accurately controlled, thereby improving height consistency of the bottom of the trench 200 in the resistor region 100*b***.

In some implementations, the interlayer dielectric layer 150 of the resistor region **100*b* is etched by using an anisotropic dry etching process, to form the trench 200. The anisotropic dry etching process has the characteristics of anisotropic etching, which is beneficial to improve the profile control of the trench 200. Moreover, the dry etching process can easily achieve a higher etching selectivity ratio, and is prone to stop on the top surface of the contact etch stop layer 170**.

It should be noted that, in some implementations, the trench 200 extends through the interlayer dielectric layer 150 of the resistor region **100*b*** by way of example for description. In other implementations, the trench may further extend through the interlayer dielectric layer and the contact etch stop layer of the resistor region. Alternatively, the trench may extend through the interlayer dielectric layer and the contact etch stop layer of the resistor region and a certain thickness of the isolation layer.

It should further be noted that, in some implementations, the method for forming a semiconductor structure further includes: forming an interconnect trench (not shown in the figure) extending through the interlayer dielectric layer 150 on a top of the source/drain doped region in the step of forming the trench 200. The interconnect trench is configured to provide a space for forming the source/drain interconnect layer.

In some implementations, the trench 200 and the interconnect trench are formed in the same step. Therefore, the trench 200 can be formed by using the process step of forming the interconnect trench, which is beneficial to simplify the process and improve the compatibility with an existing process flow during the formation of the trench 200.

Specifically, the source/drain doped region is exposed from the interconnect trench, so that the source/drain interconnect layer subsequently formed in the interconnect trench can come into contact with the source/drain doped region.

In some implementations, before the trench 200 is formed, the method for forming a semiconductor structure further includes: forming a hard mask layer 180 on the first dielectric layer 160 and the gate structure 140. The hard mask layer 180 is configured as a mask for forming the trench 200 and the interconnect trench.

In some implementations, the hard mask layer 180 is made of an insulating dielectric material. Therefore, the hard mask layer 180 can be retained in the semiconductor structure after the resistor structure is formed, so that the step of removing the hard mask layer 180 can be omitted. Etch selectivity exists between the material of the hard mask layer 180 and the material of the first dielectric layer 160. As an example, the material of the hard mask layer 180 includes silicon nitride.

In some implementations, the method for forming a semiconductor structure further includes: forming a source/drain interconnect layer in the interconnect trench after the interconnect trench is formed, where the source/drain interconnect layer is in contact with the source/drain doped region.

The source/drain interconnect layer is configured to realize the electrical connection between the source/drain doped region and the external circuit.

A material of the source/drain interconnect layer is a conductive material. In some implementations, the material of the source/drain interconnect layer includes one or more of W, Co, Cu, Ru, or Ni.

Figure 9:
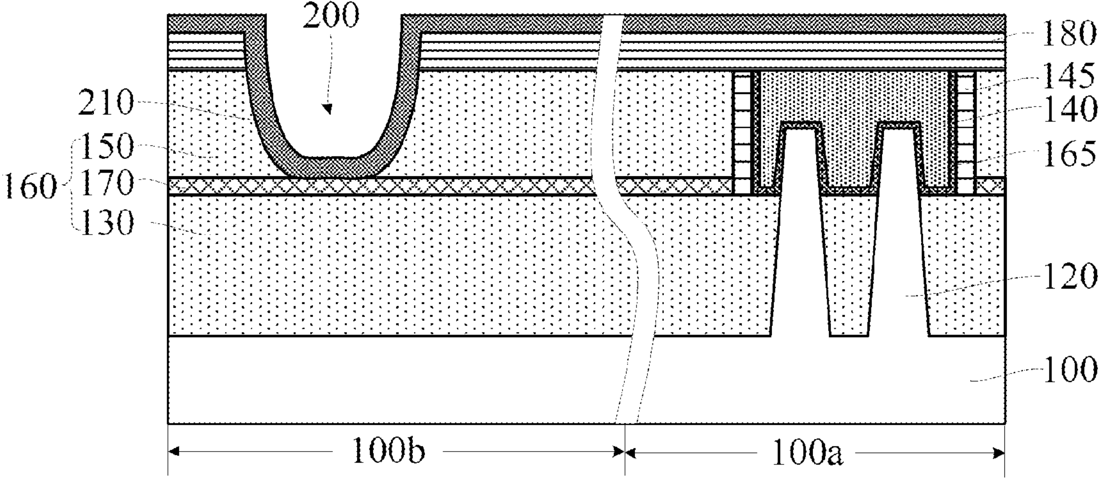

Referring to FIG. 9, a conductive layer 210 is formed on a bottom and a sidewall of the trench 200. The conductive layer 210 on the bottom and the sidewall of the trench 200 is configured as a resistor structure.

In some implementations, the conductive layer 210 is formed on the bottom and the sidewall of the trench 200, and the conductive layer 210 on the bottom and the sidewall of the trench 200 is configured as the resistor structure. Compared with the resistor structure being a sheet structure or a rectangular structure, the conductive layer 210 is not only located on the bottom of the trench 200, but also located on the sidewall of the trench 200. By using a direction parallel to the substrate 100 as a transverse direction, in a same transverse area, the equivalent conductive sectional area of the resistor structure is larger, thereby reducing the transverse area occupied by the resistor structure, and miniaturizing the device.

In some implementations, a material of the conductive layer 210 includes one or more of TiAl, TiALC, TaAlN, TiAlN, MoN, TaCN, AlN, Ta, TiN, TaN, TaSiN, TiSiN, W, Co, Al, Cu, Ag, Au, Pt, or Ni. As an example, the material of the conductive layer 210 is TiN.

In some implementations, the process for forming the conductive layer 210 includes an atomic layer deposition process. The atomic layer deposition process has a higher step coverage capability, which is beneficial to improve the deposition capability of the conductive layer 210 on the bottom and the sidewall of the trench 200, and is further beneficial to improve thickness uniformity of the conductive layer 210.

It should be noted that, in some implementations, in the step of forming the conductive layer 210, the conductive layer 210 is further formed on a top of the first dielectric layer 160.

Figures 10, 11:
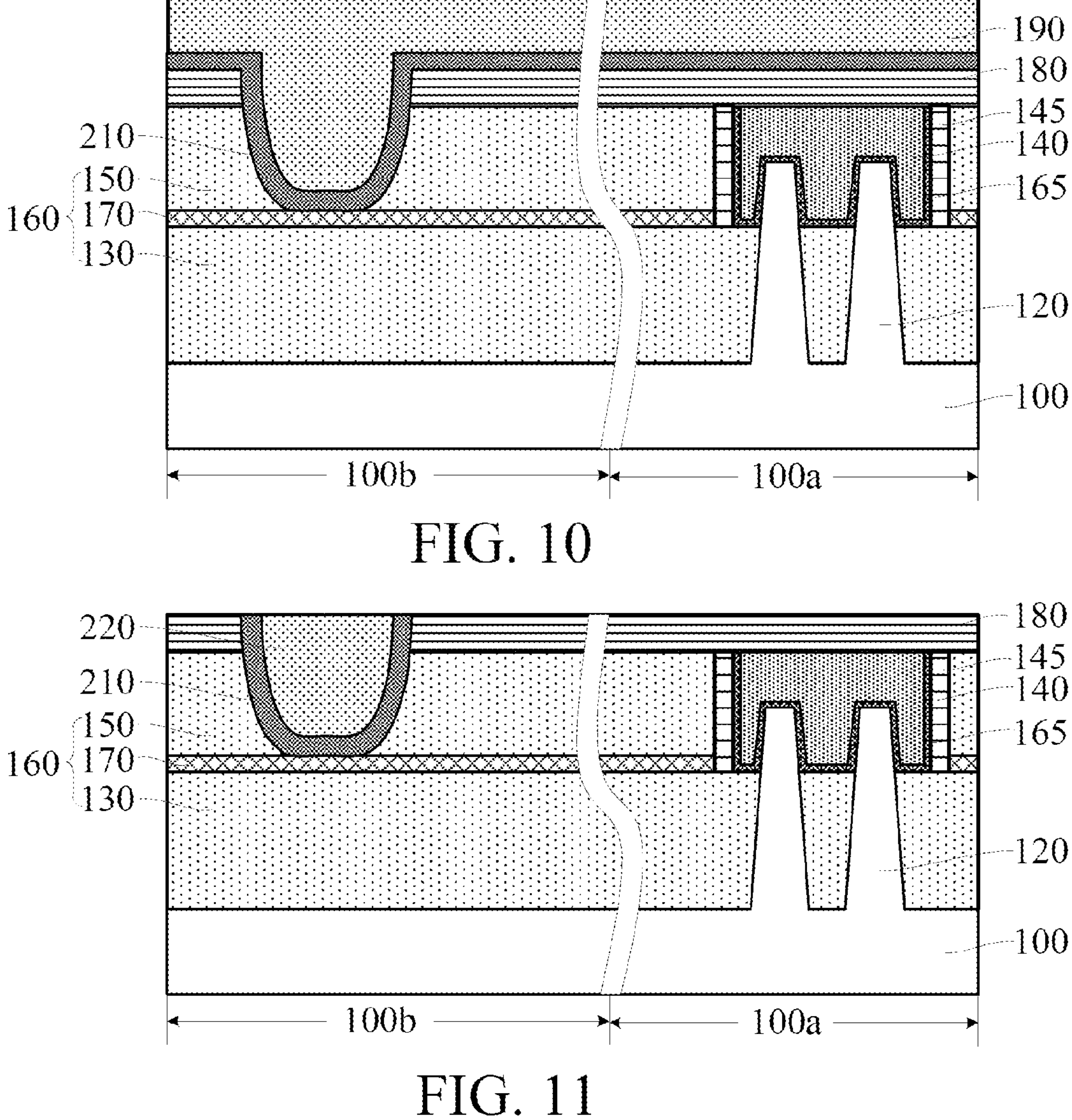

Referring to FIG. 10 and FIG. 11, a second dielectric layer 220 filled in the trench 200 is formed on the conductive layer 210.

The second dielectric layer 220 is configured to fill the trench 200 to provide a flat surface for the subsequent process.

A material of the second dielectric layer 220 is an insulating dielectric material, for example, one or more of silicon oxide, silicon nitride, or silicon oxynitride.

In some implementations, the step of forming the second dielectric layer 220 includes: forming, on the conductive layer 210, a dielectric material layer 190 filled in the trench 200, where the dielectric material layer 190 is further formed on the conductive layer 210 on the top of the first dielectric layer 160, as shown in FIG. 10.

The dielectric material layer 190 is configured to form the second dielectric layer 220.

In some implementations, the dielectric material layer 190 is formed using a chemical vapor deposition process. The chemical vapor deposition process has a desirable gap filling capability, low process costs, and high process compatibility.

As shown in FIG. 11, the conductive layer 210 and the dielectric material layer 190 on the top of the first dielectric layer 160 are removed, and the rest of the dielectric material layer 190 filled in the trench 200 is configured as the second dielectric layer 220.

In some implementations, the conductive layer 210 and the dielectric material layer 190 on the top of the first dielectric layer 160 are removed by using a planarization process. By using the planarization process, the top flatness and height uniformity of the second dielectric layer 220 and the hard mask layer 180 can be improved while removing the conductive layer 210 and the dielectric material layer 190 on the top of the first dielectric layer 160, so as to provide a flat surface for the subsequent process.

In some implementations, the planarization process is a chemical-mechanical planarization (CMP) process.

Figures 12, 13, 14:
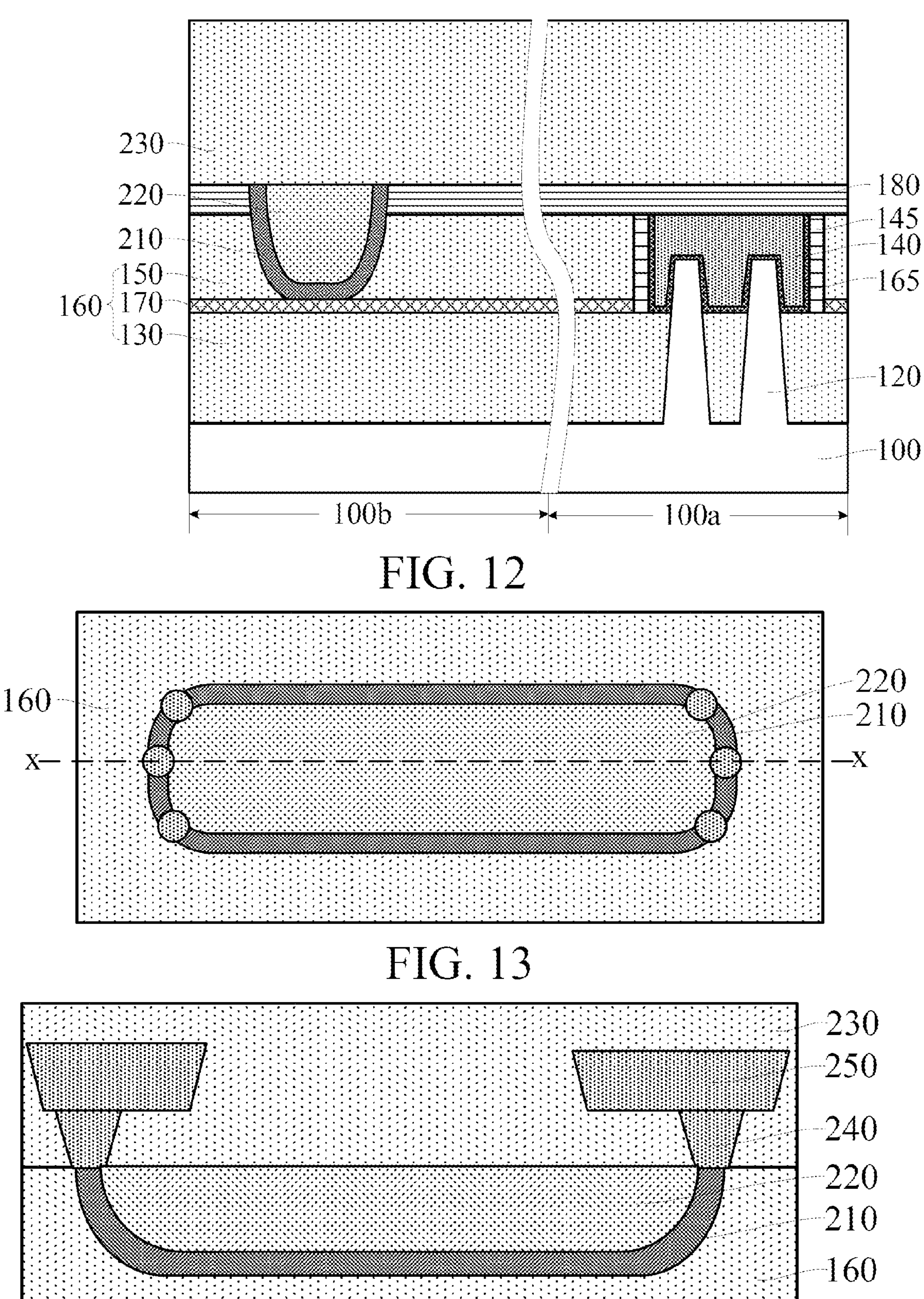

Referring to FIG. 12 to FIG. 14, FIG. 12 is a cross-sectional view substrated on FIG. 11, FIG. 13 is a top view corresponding to the resistor region 100*b* in FIG. 12, and FIG. 14 is a cross-sectional view of FIG. 13 along a direction xx. The method for forming a semiconductor structure further includes: forming a third dielectric layer 230 covering the first dielectric layer 160, the second dielectric layer 220, and the conductive layer 210 and a connection structure located in the third dielectric layer 230 and in contact with the conductive layer 210.

The connection structure is configured to realize the electrical connection between the resistor structure and the external circuit.

In the field of semiconductors, the step of forming the semiconductor structure generally further includes: forming a source/drain interconnect layer located in the first dielectric layer 160 and in contact with the source/drain doped region; forming a source/drain plug in contact with the source/drain interconnect layer; and forming a gate plug in contact with the gate structure. In some implementations, the resistor structure is located in the interlayer dielectric layer 150. Accordingly, the connection structure in contact with the resistor structure can be formed by using the process for forming the source/drain plug or forming the gate plug. In this way, the electrical connection between the resistor structure and the external circuit is realized, thereby reducing the difficulty of realizing the electrical connection between the resistor structure and the external circuit.

In some implementations, a top surface of the conductive layer 210 is flush with a top surface of the source/drain interconnect layer. In this way, the electrical connection between the conductive layer 210 and the external circuit or other interconnect structures is realized by using the process for forming the source/drain plug. In other implementations, the top surface of the conductive layer may further be flush with a top surface of the gate structure. In this way, the electrical connection between the conductive layer and the external circuit or other interconnect structures is realized by using the process for forming the gate plug.

As an example, the connection structure includes a contact plug 240 in contact with the conductive layer 210 and an interconnect layer 250 on the contact plug 240.

A material of the connection structure includes one or more of Co, W, Ru, Al, Ir, Rh, Os, Pd, Cu, Pt, Ni, Ta, TaN, Ti, or TiN.

The third dielectric layer 230 is configured to achieve electrical isolation between the connection structures. A material of the third dielectric layer 230 is an insulating dielectric material, and includes one or more of silicon oxide, silicon oxynitride, silicon nitride, silicon carbide, silicon carbonitride, silicon oxycarbonitride, silicon germanium oxide, boron nitride, or boron carbonitride.

FIG. 15 to FIG. 20 are schematic structural diagrams of steps in another form of a method for forming a semiconductor structure according to the present disclosure.

For the similarity between this form and the form described above, details are not described herein again. A difference between this form and the form described above include at least: referring to FIG. 15, in the step of providing the substrate 300, a first dummy gate structure 310 is further formed on the isolation layer 380 of the resistor region 300*b*.

The first dummy gate structure 310 is configured to occupy a space for subsequently forming the trench.

In some implementations, the first dummy gate structure 310 is a polysilicon gate structure or an amorphous silicon gate structure. A material of the first dummy gate structure 310 includes polysilicon or amorphous silicon.

In some implementations, in the step of providing the substrate 300, the gate structure in the device region 300*a* is a second dummy gate structure 320. The second dummy gate structure 320 is configured to occupy a space for forming a device gate structure.

In some implementations, a material of the second dummy gate structure 320 is the same as the material of the first dummy gate structure 310, and the material of the second dummy gate structure 320 includes polysilicon or amorphous silicon.

It should be noted that, the first dummy gate structure 310 and the second dummy gate structure 320 are formed in a same step. In this way, the first dummy gate structure 310 is formed by using the process step of forming the second dummy gate structure 320, which is beneficial to improve the process compatibility.

Referring to FIG. 16, the second dummy gate structure 320 is removed to form a gate opening (not shown in the figure). A device gate structure 330 is formed in the gate opening.

During operation of the device, the device gate structure 330 is configured to control opening and closing of a conductive channel of a transistor.

For the related description of the device gate structure 330, reference may be made to the corresponding description of the device gate structure in the form described above, as details will not be described herein again.

Referring to FIG. 17, the step of forming a trench 340 includes: removing the first dummy gate structure 310 to form the trench 340.

In some implementations, after the second dummy gate structure 320 is removed, the first dummy gate structure 310 is removed to form the trench 340.

In other implementations, in the step of removing the first dummy gate structure to form the trench, the second dummy gate structure may further be removed to form a gate opening. A device gate structure is formed in the gate opening. By removing the first dummy gate structure and the second dummy gate structure in the same step, the first dummy gate structure can be removed by using the transistor formation process for the device region, to form the trench, which improves the compatibility with the existing process during the formation of the trench.

Figures 18, 19, 20:
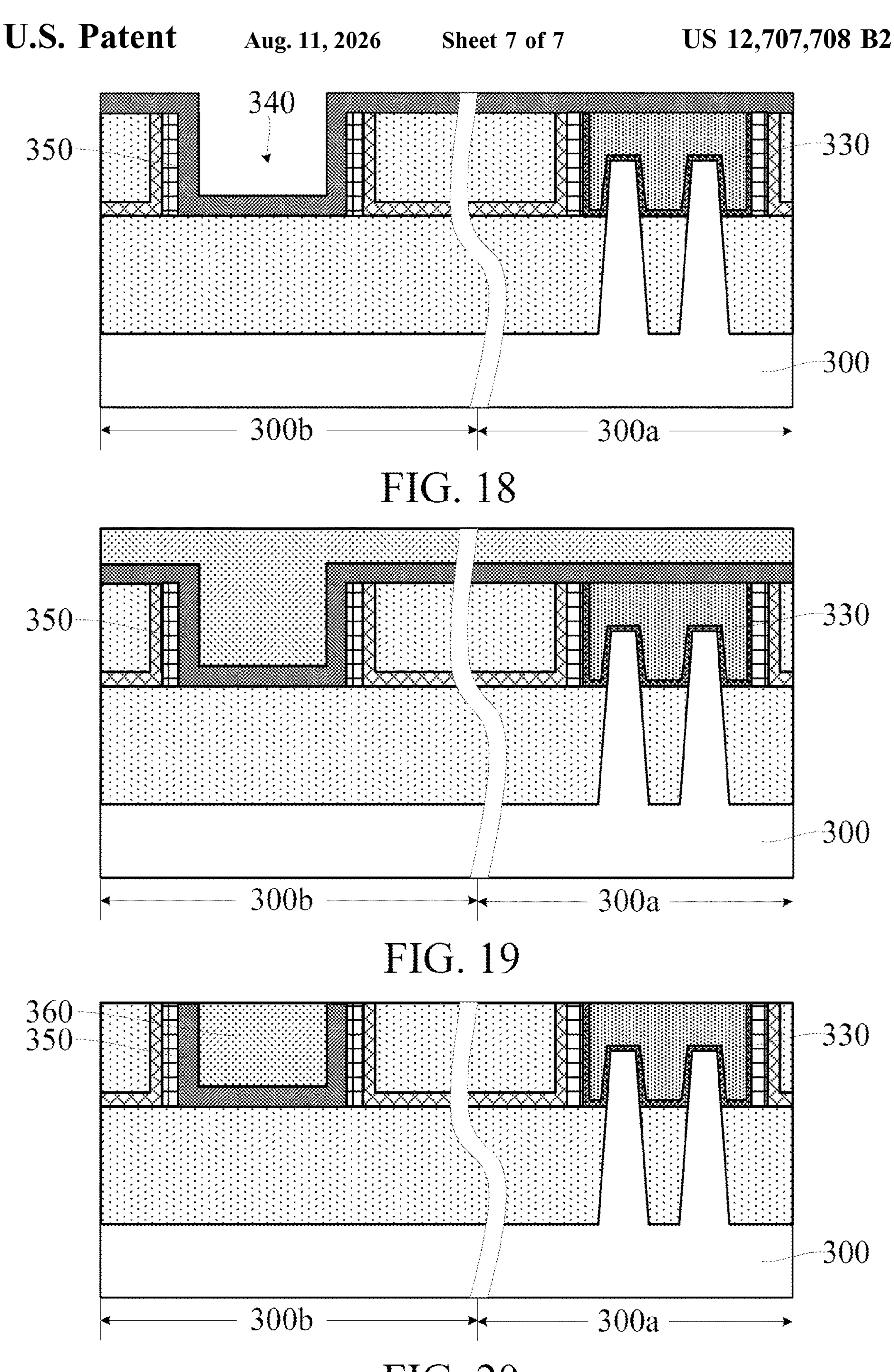

Referring to FIG. 18, a conductive layer 350 is formed on a bottom and a sidewall of the trench 340, and the conductive layer 350 on the bottom and the sidewall of the trench 340 is configured as a resistor structure.

For the detailed description of the conductive layer 350 and the resistor structure, refer to the corresponding descriptions in the form described above, and details will not be described herein again in this embodiment.

Referring to FIG. 19 and FIG. 20, a second dielectric layer 360 filled in the trench 340 is formed on the conductive layer 350. For the detailed description of the second dielectric layer 360, refer to the corresponding description of the second dielectric layer 220 in the form described above, as details will not be described herein again.

Although the present disclosure is disclosed above, the present disclosure is not limited thereto. Any person skilled in the art can make various changes and modifications without departing from the spirit and the scope of the present disclosure. Therefore, the protection scope of the present disclosure should be subject to the scope defined by the claims.

What is claimed is:

1. A semiconductor structure, comprising:

a substrate comprising a device region configured to form a transistor and a resistor region configured to form the resistor structure;

a first dielectric layer, located on the substrate;

a trench, located in the first dielectric layer;

a conductive layer, located on a bottom and a sidewall of the trench and configured as a resistor structure;

a second dielectric layer, configured to be filled in the trench where the conductive layer is formed;

a channel structure, located on the substrate of the device region;

an isolation layer, located on the substrate and surrounding the channel structure; and an interlayer dielectric layer, located on the isolation layer, wherein the interlayer dielectric layer and the isolation layer are configured as a first dielectric layer.

2. The semiconductor structure according to claim 1, wherein:

the semiconductor structure further comprises:

the trench extends through the interlayer dielectric layer of the resistor region.

3. The semiconductor structure according to claim 2, wherein:

the semiconductor structure further comprises: a contact etch stop layer, located between the isolation layer and the interlayer dielectric layer, and the contact etch stop layer is exposed from the bottom of the trench.

4. The semiconductor structure according to claim 2, further comprising:

a gate structure, located on the isolation layer of the device region and spanning the channel structure;

a source/drain doped region, located on two sides of the gate structure and in contact with end portions of the channel structure along an extending direction; and a source/drain interconnect layer, extending through the interlayer dielectric layer on a top of the source/drain doped region and in contact with the source/drain doped region.

5. The semiconductor structure according to claim 2, wherein:

the trench is located in the interlayer dielectric layer of the resistor region and the isolation layer is exposed from the trench; and the semiconductor structure further comprises: a spacer, located on a sidewall of the gate structure and between a sidewall of the conductive layer and the interlayer dielectric layer.

6. The semiconductor structure according to claim 5, further comprising: a contact etch stop layer, located between the isolation layer and the interlayer dielectric layer and between the spacer and the interlayer dielectric layer.

7. The semiconductor structure according to claim 1, wherein a material of the conductive layer comprises at least one of TiAl, TiALC, TaAlN, TiAlN, MoN, TaCN, AlN, Ta, TiN, TaN, TaSiN, TiSiN, W, Co, Al, Cu, Ag, Au, Pt, or Ni.

* * * * *